(12) United States Patent
Ichikawa et al.

(10) Patent No.: US 6,784,464 B2
(45) Date of Patent: Aug. 31, 2004

(54) SEMICONDUCTOR LASER DEVICE AND WIRE BONDING METHOD CAPABLE OF EASILY PERFORMING RELIABLE WIRE BONDING

(75) Inventors: Hideki Ichikawa, Shiki-gun (JP); Mamoru Okanishi, Shiki-gun (JP); Terumitsu Santo, Gojo (JP); Toshihiko Yoshida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/396,402

(22) Filed: Mar. 26, 2003

(65) Prior Publication Data

US 2003/0165167 A1 Sep. 4, 2003

Related U.S. Application Data

(62) Division of application No. 09/803,658, filed on Mar. 12, 2001, now Pat. No. 6,562,693.

(30) Foreign Application Priority Data

Mar. 14, 2000 (JP) .......................................... 2000-70223

(51) Int. Cl.[7] .......................... H01L 33/00; H01L 23/48
(52) U.S. Cl. .............................. 257/99; 257/79; 257/82; 257/693; 257/694
(58) Field of Search ............................... 257/79–82, 99, 257/678–680, 690–697, 704, 711, 729

(56) References Cited

U.S. PATENT DOCUMENTS

| | | | | |
|---|---|---|---|---|
| 4,267,559 A | * | 5/1981 | Johnson et al. ................ 257/99 |
| 4,722,060 A | * | 1/1988 | Quinn et al. ................. 364/490 |
| 4,768,070 A | * | 8/1988 | Takizawa et al. ............. 357/17 |
| 5,089,861 A | * | 2/1992 | Tanaka et al. ................ 372/36 |
| 5,212,699 A | * | 5/1993 | Masuko et al. ............... 372/34 |
| 5,262,675 A | * | 11/1993 | Bausman, Jr. .............. 257/714 |
| 5,504,349 A | | 4/1996 | Yoshino |
| 5,668,822 A | * | 9/1997 | Tada ........................... 372/36 |
| 5,689,492 A | * | 11/1997 | Brazas et al. .......... 369/112.09 |
| 5,878,069 A | * | 3/1999 | Kamibayashi et al. ........ 372/36 |
| 6,171,877 B1 | * | 1/2001 | Webb .......................... 438/25 |
| 6,266,314 B1 | * | 7/2001 | Fukakusa et al. .......... 368/112 |
| 6,700,138 B2 | * | 3/2004 | Crane et al. ................. 257/99 |
| 6,703,561 B1 | * | 3/2004 | Rosenberg et al. ........ 174/52.5 |
| 6,707,073 B1 | * | 3/2004 | Yamamoto et al. .......... 257/99 |

FOREIGN PATENT DOCUMENTS

| | | |
|---|---|---|
| JP | 7-58413 | 3/1995 |
| JP | 11-97804 | 4/1999 |
| JP | 11-145548 | 5/1999 |
| JP | 2000-151006 A | 5/2000 |

\* cited by examiner

Primary Examiner—Michael Lebentritt
(74) Attorney, Agent, or Firm—Nixon & Vanderhye, P.C.

(57) ABSTRACT

There is provided is a semiconductor laser device capable of simplifying fabricating processes with a simple construction and easily mounting two semiconductor laser elements and a monitoring PD on a compact package and a wire bonding method for the semiconductor laser device. There are provided a stem 100 provided with a plurality of lead pins 121 through 124, a sub-mount 160 that is die-bonded onto the stem 100 and has its surface formed integrally with a monitoring PD 140 and two semiconductor laser elements 131 and 132 that are die-bonded onto the sub-mount 160 and have emission light monitored by the monitoring PD 140. A first bonding surface i.e. anode electrode 183 of the monitoring PD 140 and a second bonding surface i.e. end surface 123a of a lead pin 123 that is approximately perpendicular to the first bonding surface are wire-bonded to each other.

7 Claims, 12 Drawing Sheets

SEMICONDUCTOR LASER DEVICE AND WIRE BONDING METHOD CAPABLE OF EASILY PERFORMING RELIABLE WIRE BONDING

This application is a division of application Ser. No. 09/803,658 filed Mar. 12, 2001, now U.S. Pat. No. 6,562,693 the entire content of which is hereby incorporated by reference in this application.

BACKGROUND OF THE INVENTION

The present invention relates to a semiconductor laser device including two semiconductor laser elements and a wire bonding method for the device.

Conventionally, there has been a semiconductor laser device in which one semiconductor laser element and a monitoring use photodiode (hereinafter referred to as a monitoring PD) for monitoring an output of the semiconductor laser element are arranged on a metallic stem. However, in order to read information from a recorded medium such as a CD (compact disc) and a DVD (digital versatile disk), there is needed a semiconductor laser device that emits two kinds of laser light of different wave lengths by means of two semiconductor laser elements.

Accordingly, there can be considered a semiconductor laser device as shown in FIG. 12 where two semiconductor laser elements and a monitoring PD for monitoring the output of the semiconductor laser element are arranged. FIG. 12 shows a perspective view of the inside of this semiconductor laser device with its cap removed. It is to be noted that this semiconductor laser device is shown for facilitating the explanation of this invention and is not the prior art.

As shown in FIG. 12, this semiconductor laser device includes a metallic stem 200 having an eyelet 201 and a heat radiation base 202 which are integrally formed. Lead pins 221 through 223 are mounted on the eyelet 201 of the stem 200 so that one end penetrates the eyelet 201 of the stem 200, and one end of a lead pin 224 is electrically connected as a common electrode to the eyelet 201. The lead pins 221 through 223 are fixed to the eyelet 201 with a low melting point glass and electrically insulated with respect to the stem 200. The eyelet 201 has an outer diameter of 5.6 mm, and the lead pins 221 through 224 constructed of a columnar metal having a diameter of 0.4 mm are arranged at regular intervals of 90 degrees in a circle of a diameter of 2 mm.

A silicon sub-mount (hereinafter referred to as an Si sub-mount) 260 is die-bonded to the heat radiation base 202 formed integrally with the eyelet 201 with a conductive paste (not shown). Two semiconductor laser elements 231 and 232 are die-bonded onto the silicon sub-mount 260 with a brazing material (not shown) made of an Au—Sn alloy. The die bonding surface of the Si sub-mount 260 is covered with a metal, providing a common electrode of the semiconductor laser elements 231 and 232. The common electrode on the surface of the Si sub-mount 260 is connected to the heat radiation base 202 via metal wires 252 and 254, respectively. On the other hand, upper electrodes of the semiconductor laser elements 231 and 232 are connected to the lead pins 221 and 222 via metal wires 251 and 253, respectively. A monitoring PD 240 is die-bonded to a recess 201b formed on the eyelet 201 of the stem 200 with a conductive paste (not shown), and an upper electrode of the monitoring PD 240 is connected to an end surface 223a of the lead pin 223 via a metal wire 255.

The two semiconductor laser elements 231 and 232 are provided particularly by a combination of an InGaAlP based semiconductor laser element 231 that emits red laser light (having a wavelength of 630 nm to 680 nm) and an AlGaAs based semiconductor laser element 232 that emits infrared laser light (having a wavelength of 760 nm to 850 nm).

It is required to die-bond the semiconductor laser elements 231 and 232 onto the Si sub-mount 260 by using a brazing material (Au—Sn alloy, for example) whose melting point is sufficiently higher than a temperature of 80° C., which is the upper limit of the normal use temperature range so as not to move the relative positions of the light emitting points of the two semiconductor laser elements 231 and 232 in operation. If the semiconductor laser elements 231 and 232 are die-bonded directly to the metallic heat radiation base 202, then there is the problem that an intense stress is applied to the semiconductor laser elements 231 and 232 due to a difference in the linear expansion coefficient of the metal and the semiconductor, consequently destroying and deteriorating the crystal. Therefore, it is indispensable to perform the die bonding to the Si sub-mount 260.

The semiconductor laser device having two semiconductor laser elements shown in FIG. 12 has the problem of complicated structure, and the processes of die-bonding the monitoring PD 240 and the Si sub-mount 260 increase cost.

Accordingly, it can be considered to simplify the fabricating processes by forming a monitoring PD on the surface of the Si sub-mount and eliminating the die bonding process of the monitoring PD. If the above-mentioned structure is adopted, then the electrode surface of the monitoring PD becomes parallel to the electrode surfaces of the two semiconductor laser elements and the electrode surface formed on the surface of the Si sub-mount. The wire bonding cannot easily be performed unless the surfaces of the electrodes of the semiconductor laser elements and the monitoring PD and the surfaces of the lead pins to which metal wires are to be bonded are parallel to one another when connecting the electrodes of these semiconductor laser elements and the monitoring PD with the lead pins by way of metal wires. This will be described below on the basis of the semiconductor laser device of the construction shown in FIG. 12 (monitoring PD is assumed to be formed on the surface of the Si sub-mount).

In this semiconductor laser device, the two semiconductor laser elements 231 and 232 are connected to the lead pins 221 and 222, respectively, located on both sides. Accordingly, there is only the lead pin 223 that is located on the upper side in FIG. 12 and is able to be connected to the electrode of the monitoring PD formed on the surface of the Si sub-mount. In this case, there is the problem that almost no surface parallel to the electrode of the monitoring PD to be formed on the Si sub-mount 260 exists since the tip of the lead pin 223 is not protruding from a surface 201a of the eyelet 201. As a method for solving this problem, it can also be considered to provide a recess around the lead pin 223 on the eyelet 201 to expose the lead pin 223 and perform die-bonding to the outer peripheral surface of the cylindrical lead pin 223. However, such a recess may penetrate the eyelet 201 to disable the sealing of the inside with a cap (not shown), which would cause a problem that the semiconductor laser elements easily deteriorate.

When wire-bonding the end surface 223a of the lead pin 223 to the electrode of the monitoring PD formed on the Si sub-mount 260, the end surface 223a of the lead pin 223 and the electrode surface of the monitoring PD are perpendicular to each other, and therefore, it has been difficult to connect the surfaces together by the conventional wire bonding method. The reason for the above will be described below with reference to FIG. 13 through FIG. 19, which show the wire bonding processes of the semiconductor laser device of FIG. 12.

First of all, the wire bonding method for connecting the electrode surface of the monitoring PD 240 of the semiconductor laser device 200 shown in FIG. 12 with the end surface 223a of the lead pin 223 by way of a metal wire will be described with reference to FIG. 13 through FIG. 18.

As shown in FIG. 13, a bonding head 70 has a capillary 71 attached to the tip of a capillary holder 72 and a wire clamp 73, and the capillary 71 and the wire clamp 73 move in such a manner as an integrated body. The capillary 71 has a tip diameter of about 200 μm and operates to guide a metal wire 50 kept linear. A gold wire having a diameter of 25 μm is used as this metal wire 50, and a ball 50a is formed by arc discharge or the like at the tip of the metal wire 50 that protrudes from the tip of the capillary 71.

Next, the bonding head 70 is moved down as shown in FIG. 14 to bring the ball 50a (shown in FIG. 13) in contact with the electrode surface of the monitoring PD 240, and supersonic vibrations are applied to the ball 50a to connect the ball 50a to the electrode of the monitoring PD 240 (the point to which this ball 50a is connected is referred to as a "first bond").

Next, the bonding head 70 is moved up with the wire clamp 73 opened as shown in FIG. 15 to draw the metal wire 50, while the stem 200 is properly turned around an axis perpendicular to the axial direction of the capillary 71 to set the bonding surface 223a of the lead pin 223 perpendicular to the axial direction of the capillary 71.

Next, as shown in FIG. 16, the bonding head 70 is moved along a plane parallel to the bonding surface 223a of the lead pin 223 so as to locate the bonding surface 223a of the lead pin 223 perpendicularly below the capillary 71. If the electrode surface of the monitoring PD 240 and the bonding surface 223a of the lead pin 223 are not located in an identical plane with respect to the metal wire 50 guided by the capillary 71 in this stage, then it is proper to move the stem 200 so that the bonding surface 223a of the lead pin 223 is located on the axis of the capillary 71.

As shown in FIG. 17, the bonding head 70 is moved down again to bring the metal wire 50 in contact with the bonding surface 223a of the lead pin 223, and supersonic vibrations are applied to the metal wire 50 to connect the metal wire 50 to the bonding surface 223a of the lead pin 223 (the point to which this metal wire is connected is referred to as a "second bond").

Finally, as shown in FIG. 18, the metal wire 50 is cut by closing the wire clamp 73 and moving up the bonding head 70 in this state. Subsequently, a metal ball is formed at the tip of the wire 50 by arc discharge although not shown, and the process flow returns to the first process.

According to the aforementioned wire bonding method, there is no particular problem wherever the axis of the center of turn of the stem 200 exists since the bonding surface of the first bond and the bonding surface of the second bond make an angle of about 13° between them. However, there is the problem that, if the angle of turn of the stem 200 is further increased, then the capillary 71 might be damaged by being brought in contact with the stem 200, the semiconductor laser element or the like, and as shown in FIG. 19, this leads to the problem that the metal wire 50 might be significantly bent at the tip of the capillary 71 or distorted and cut in the portions of the first bond and the tip of the capillary 71.

When die-bonding the Si sub-mount 260 to the heat radiation base 202 in the semiconductor laser device shown in FIG. 12, it is desirable to fix them with a conductive paste obtained by filling a resin with a conductive material (silver filler, for example) so as not to exert a thermal influence on the brazing material that fixes the semiconductor laser elements 231 and 232 to the Si sub-mount 260. However, there is the problem that the wire bonding cannot be performed when smoothness is lost due to the conductive paste adhering to the surface to which the metal wire is to be bonded, since the conductive paste has high liquidity and tends to spread over the die-bonding surface.

SUMMARY OF THE INVENTION

Accordingly, the object of the present invention is to provide a semiconductor laser device capable of simplifying the fabricating processes with a simple construction and easily mounting two semiconductor laser elements and a monitoring PD on a compact package and a wire bonding method for the above-mentioned semiconductor laser device capable of easily performing reliable wire bonding without damaging a stem, the semiconductor laser elements and so on.

In order to achieve the aforementioned object, the present invention provides a semiconductor laser device comprising:

a stem provided with a plurality of lead pins;

a sub-mount that is die-bonded onto the stem and has a surface formed integrally with a monitoring photodiode; and two semiconductor laser elements that are die-bonded onto the sub-mount and have emission light monitored by the monitoring photodiode, the semiconductor laser elements having electrodes electrically connected to the respective lead pins via metal wires and the monitoring photodiode having an electrode electrically connected to the corresponding lead pin via a metal wire, wherein at least one first bonding surface of the two semiconductor laser elements and the monitoring photodiode is approximately perpendicular to a second bonding surface of the lead pin to be wire-bonded to the first bonding surface.

According to the semiconductor laser device having the above-mentioned construction, the electrodes of the two semiconductor laser elements and the electrode of the monitoring PD have mutually parallel electrode surfaces, and at least one of those three electrode surfaces is made to serve as a first bonding surface, which is wire-bonded to the second bonding surface of the lead pin approximately perpendicular to the first bonding surface. For example, in a small-size package having a diameter of 5.6 mm with a limited number of lead pins, the two semiconductor laser elements are arranged on the stem so that the optical axes of the emission light of the two semiconductor laser elements become parallel to each other and perpendicular to the stem surface (eyelet surface). If two lead pins exist on both sides of the direction of arrangement and another lead pin exists in a direction perpendicular to the direction of arrangement, then the electrodes of the semiconductor laser elements and the electrode of the monitoring PD are assigned to the three lead pins, and the electrodes and the lead pins are connected together by wire bonding (the other electrode of each element is connected to the stem that serves as a common electrode). In the above case, tangent planes on the peripheries of the lead pins on both sides of the direction of arrangement of the two semiconductor laser elements and two electrode surfaces out of the electrode of the semiconductor laser elements and the electrode of the monitoring PD become parallel to each other, allowing the wire bonding to be easily performed. However, the electrode surface (first bonding surface) of the remaining element, which is also parallel to a tangent plane on the periphery of the remaining lead pin, is wire-bonded to the end surface (second bonding surface) of the lead pin that is approximately perpendicular to the electrode surface (first bonding surface) of the remaining element. By thus enabling the wire bonding of the first and second bonding surfaces that are approximately perpendicular to each other, the fabricating processes can be simplified with a simple construction, and a semiconductor laser element capable of easily mounting the stem of a small-size package with two semiconductor laser elements and a monitoring PD can be provided. It is to be noted that a sub-mount to which the two semiconductor laser elements are to be die-bonded is provided by a sub-mount made of a semiconductor such as silicon so that a stress due to thermal expansion will not be applied to the semiconductor laser element.

In the semiconductor laser device of one embodiment, a bonding position of the first bonding surface and a bonding position of the second bonding surface are located in an identical plane approximately perpendicular to the first and second bonding surfaces.

According to the semiconductor laser device of the above embodiment, the bonding position of the first bonding surface and the bonding position of the second bonding surface are located in the identical plane approximately perpendicular to the first and second bonding surfaces. With this arrangement, the stem is turned along the identical plane in the wire bonding stage. Therefore, the metal-wire is not twisted and no stress is applied to the semiconductor laser elements and the monitoring PD to which the metal wires are connected. Therefore, the reliability can be improved.

The semiconductor laser device of one embodiment further comprises metal lines, which are formed on the sub-mount and to which the two semiconductor laser elements are respectively die-bonded, wherein
the metal lines corresponding to the semiconductor laser elements are electrically insulated from each other.

According to the semiconductor laser device of the above embodiment, the metal lines, which are located on the sub-mount and to which the semiconductor laser elements are die-bonded, are independent metal lines provided for the respective semiconductor laser elements and electrically insulated from each other. This arrangement allows the two semiconductor laser elements to have different electrical characteristics on the die-bonding side. For example, it is acceptable to die-bond the p-electrode side of one semiconductor laser element and die-bond the n-electrode side of the other semiconductor laser element. Therefore, the conditions of the semiconductor laser elements to be employed have greater tolerance.

The semiconductor laser device of one embodiment further comprises metal lines, which are formed on the sub-mount and to which the two semiconductor laser elements are die-bonded, wherein
no metal line is formed from a rear end surface of at least one of the two semiconductor laser elements toward the monitoring photodiode.

According to the semiconductor laser device of the above embodiment, at least one of the metal lines is prevented from protruding from the semiconductor laser element toward the monitoring PD in the vicinity of the emission end surfaces of the semiconductor laser elements in order to make the largest amount of emission light from the semiconductor laser incident on the monitoring PD formed integrally with the sub-mount. This arrangement is effective particularly for the semiconductor laser element whose light emitting point is located several micrometers higher than the surface of the sub-mount.

In the semiconductor laser device of one embodiment, an end surface of the lead pin is the second bonding surface, and
the end surface of the lead pin is located at a height equal to a height of the surface of the stem or lower than the height of the surface of the stem.

According to the semiconductor laser device of the above embodiment, the capillary of the wire bonding apparatus can be prevented from striking against the lead pin that has the second bonding surface when performing wire bonding to the first bonding surface since the end surface of the lead pin, or the second bonding surface is located at the same height as that of the surface of the stem or lower than the surface of the stem.

In the semiconductor laser device of one embodiment, the stem is provided with stepped portions having bonding surfaces that are parallel to and different in height from a surface to which the sub-mount is bonded.

According to the semiconductor laser device of the above embodiment, the stem is provided with the stepped portions having the bonding surfaces that are parallel to and different in height from the surface to which the sub-mount is bonded. This arrangement eliminates the possibility of the occurrence of the problem that the wire bonding cannot be performed since the conductive paste on the stem surface to which the sub-mount is bonded does not adhere to the wire bonding surface.

The present invention also provides a semiconductor laser device comprising:
a stem provided with a plurality of lead pins;
a sub-mount die-bonded onto the stem; and
a semiconductor laser element die-bonded onto the sub-mount the semiconductor laser element having an electrode electrically connected to the lead pin via a metal wire, wherein
the stem is provided with stepped portions having bonding surfaces that are parallel to and different in height from a surface to which the sub-mount is bonded.

According to the semiconductor laser device of the above embodiment, the stem is provided with the stepped portions having the bonding surfaces that are parallel to and different in height from the surface to which the sub-mount is bonded. This arrangement eliminates the possibility of the occurrence of the problem that the wire bonding cannot be performed since the conductive paste on the stem surface on which the sub-mount is bonded does not adhere to the wire bonding surface.

The present invention also provides a wire bonding method for a semiconductor laser device comprising a stem provided with a plurality of lead pins; a sub-mount that is mounted on the stem and has a surface formed integrally with a monitoring photodiode; and two semiconductor laser elements that are die-bonded onto the sub-mount and have emission light monitored by the monitoring photodiode, the method comprising:
a first step for retaining the stem so that an axis of a capillary for guiding a metal wire becomes perpendicular to at least one first bonding surface of the two semiconductor laser elements and the monitoring photodiode and bonding one end of the metal wire to the first bonding surface; and a second step for turning the stem so that the axis of the capillary becomes perpendicular to a second bonding surface of the lead pin approximately perpendicular to the first bonding surface around an axis perpendicular to the metal wire after performing bonding of one end of the metal wire to the first bonding surface and bonding the other end of the metal wire to the second bonding surface.

According to the above semiconductor laser device wire bonding method, the stem is retained so that the axis of the capillary of the wire bonding apparatus becomes perpendicular to at least one first bonding surface of the two semiconductor laser elements and the monitoring photodiode, and one end of the metal wire is bonded to the first bonding surface. Thereafter, the stem is turned so that the axis of the capillary becomes perpendicular to the second bonding surface of the lead pin approximately perpendicular to the first bonding surface around the axis perpendicular to the metal wire, and the other end of the metal wire is bonded to the second bonding surface. Through these processes, the metal wire can be connected to the first and second bonding surfaces that are about perpendicular to each other without twisting the metal wire to be bonded to the first and second bonding surfaces. Therefore, a semiconductor laser device capable of housing the two semiconductor laser elements and the monitoring PD in a small-size package can easily be subjected to wire bonding without damaging the stem, the semiconductor laser elements and so on.

According to the semiconductor laser device wire bonding method of one embodiment, the axis of turn of the stem in the second step is parallel to a line of intersection of the first and second bonding surfaces that are approximately perpendicular to each other.

According to the semiconductor laser device wire bonding method of the above embodiment, the axis of turn of the stem in the second step is made parallel to the line of intersection of the first and second bonding surfaces that are about perpendicular to each other, and the wire bonding is observed in the direction of the axis of turn of the stem. By this operation, the wire bonding can be performed while observing how the metal wire is twisted. Therefore, the bonding is not failed, and the wire bonding can be reliably performed.

According to the semiconductor laser device wire bonding method of one embodiment, a bonding position of the first bonding surface and a bonding position of the second bonding surface are located in an identical plane approximately perpendicular to the first and second bonding surfaces.

According to the semiconductor laser device wire bonding method of the above embodiment, the bonding position of the first bonding surface and the bonding position of the second bonding surface are located in the identical plane about perpendicular to the first and second bonding surfaces, and the stem is turned along the identical surface in the wire bonding stage. Therefore, the metal wire is not twisted, and no stress is applied to the semiconductor laser element and the monitoring PD to which the metal wires are connected. Therefore, the reliability can be improved.

According to the semiconductor laser device wire bonding method of one embodiment, a distance from the axis around which the stem is turned in the second step to the first bonding surface is set equal to a distance from the axis around which the stem is turned to the second bonding surface.

According to the semiconductor laser device wire bonding method of the above embodiment, the distance from the axis around which the stem is turned to the first bonding surface is set equal to the distance from the axis to the second bonding surface. With this arrangement, the distances- from the tip of the capillary to the first bonding surface and the second bonding surface becomes equal before and after the turn. Therefore, the wire bonding can easily be performed, and the bonded metal wire is hard to come off.

According to the semiconductor laser device wire bonding method of one embodiment, a length of the metal wire that is drawn out of a tip of the capillary by pulling up the capillary in a direction perpendicular to the first bonding surface after the first step is made longer than a length from a front end surface of the semiconductor laser element to a bonding position of the first bonding surface.

According to the semiconductor laser device wire bonding method of the above embodiment, the length of the metal wire to be drawn out of the tip of the capillary when the capillary is pulled up in the direction perpendicular to the first bonding surface after performing the bonding to the first bonding surface is made longer than the distance from the front end surface of the semiconductor laser element to the bonding position of the first bonding surface. With this arrangement, the capillary can be prevented from striking against the semiconductor laser element when the stem is turned.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
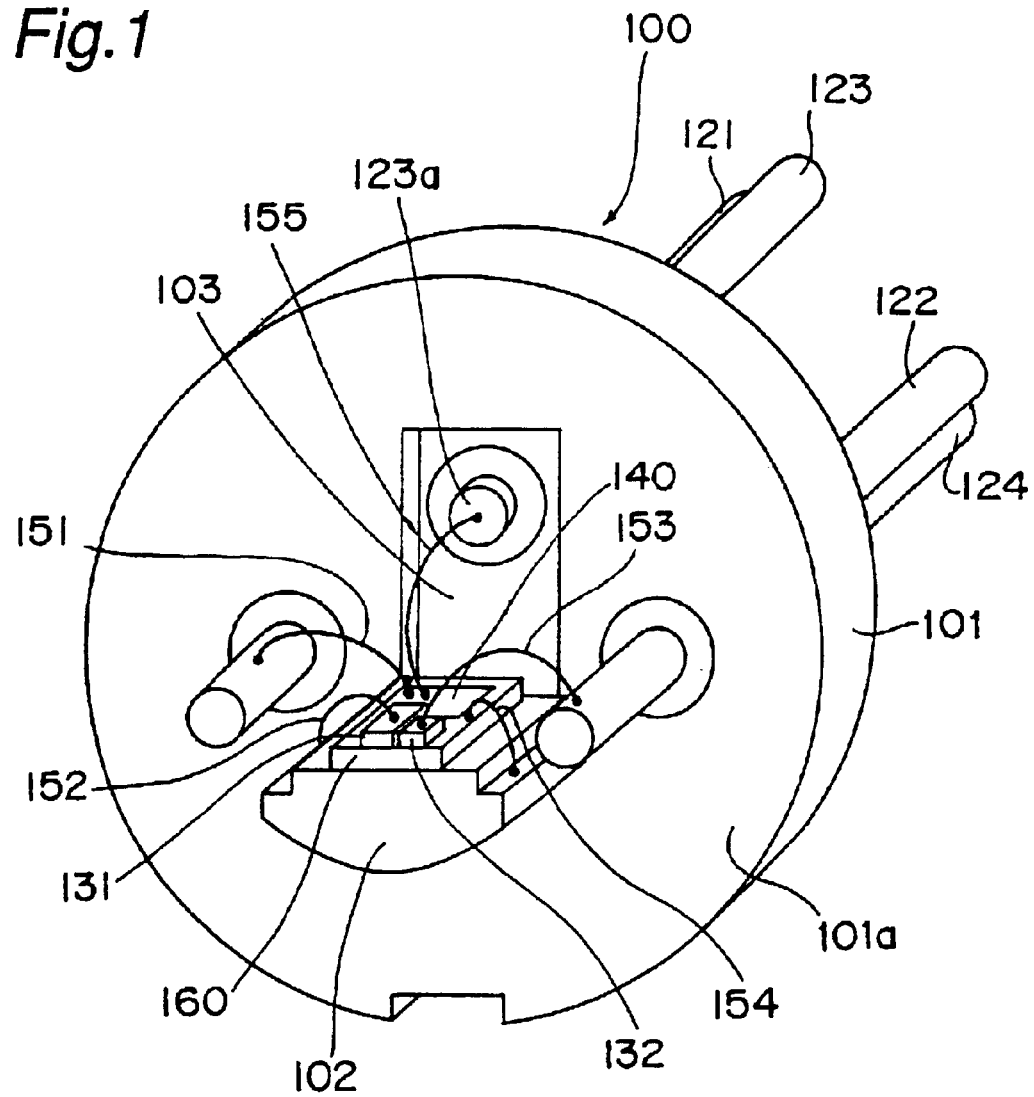
FIG. 1 is a perspective view of a semiconductor laser device having two semiconductor laser elements according to an embodiment of the present invention.

The semiconductor laser device and the wire bonding method of the present invention will be described in detail below on the basis of the embodiments thereof shown in the drawings.

FIG. 1 is a perspective view showing the inside of a semiconductor laser device according to an embodiment of the present invention, with its cap removed.

As shown in FIG. 1, this semiconductor laser device comprises a metallic stem 100 having an eyelet 101 and a heat radiation base 102, which are formed integrally. Lead pins 121 through 123 are mounted in the eyelet 101 of the stem 100 so that ends of the lead pins 121 through 123 penetrate the eyelet 101 of the stem 100, and one end of the lead pin 124 used as a common electrode is electrically connected to the eyelet 101. The lead pins 121 through 123 are fixed to the eyelet 101 with a low melting point glass and electrically insulated with respect to the stem 100. The eyelet 101 has an outer diameter of 5.6 mm, and the lead pins 121 through 124 having a cylindrical shape of a diameter of 0.4 mm and made of metal are arranged at regular intervals of 90 degrees in a circle of a diameter of 2 mm on the eyelet 101.

Figure 2:
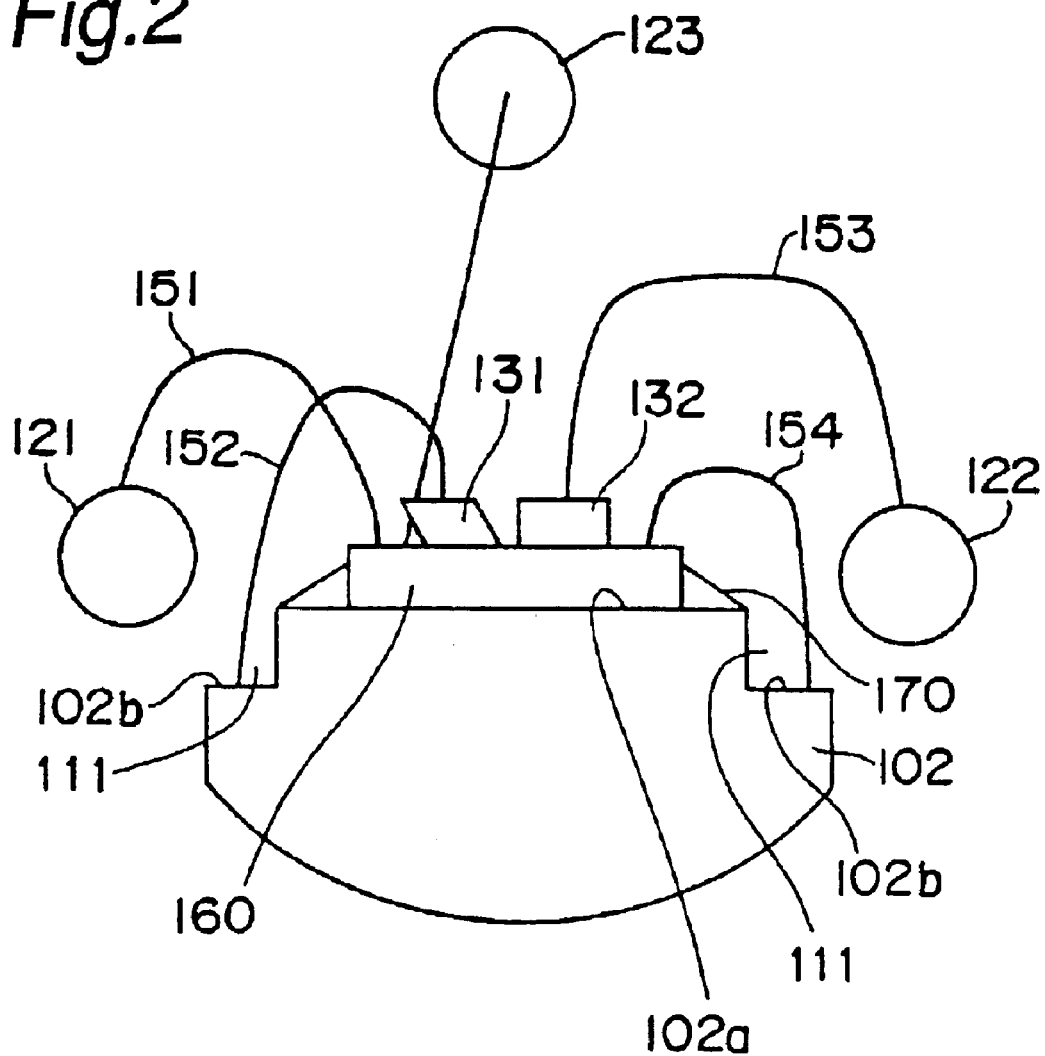
FIG. 2 is a front view of the essential part of the above semiconductor laser device.

An Si sub-mount 160 is die-bonded to the heat radiation base 102 formed integrally with the eyelet 101 with silver paste 170 (shown in FIG. 2) that is a conductive paste. A monitoring PD 140 is formed integrally with the surface of this Si sub-mount 160. Further, two semiconductor laser elements 131 and 132 are die-bonded onto the Si sub-mount 160 with a brazing material (not shown) made of an Au—Sn alloy. As shown in FIG. 2, an upper electrode of the semiconductor laser element 131 is connected to a surface 102b of a stepped portion 111 of the heat radiation base 102 via a metal wire 152, and an upper electrode of the semiconductor laser element 132 is connected to the lead pin 122 via a metal wire 153. On the other hand, a metal line 181 (shown in FIG. 3) on the surface of the Si sub-mount 160 is connected to the lead pin 121 via a metal wire 151, and a metal line 182 (shown in FIG. 3) on the surface of the Si sub-mount 160 is connected to a surface 102b of the stepped portion 111 of the heat radiation base 102 via a metal wire 154 (see FIG. 3).

It is to be noted that the eyelet 101 is provided with a recess 103 located in a rectangular region that includes the periphery of the lead pin 123, so that the end surface 123a of the lead pin 123 does not protrude from the surface 101a of the eyelet 101.

Figure 3:
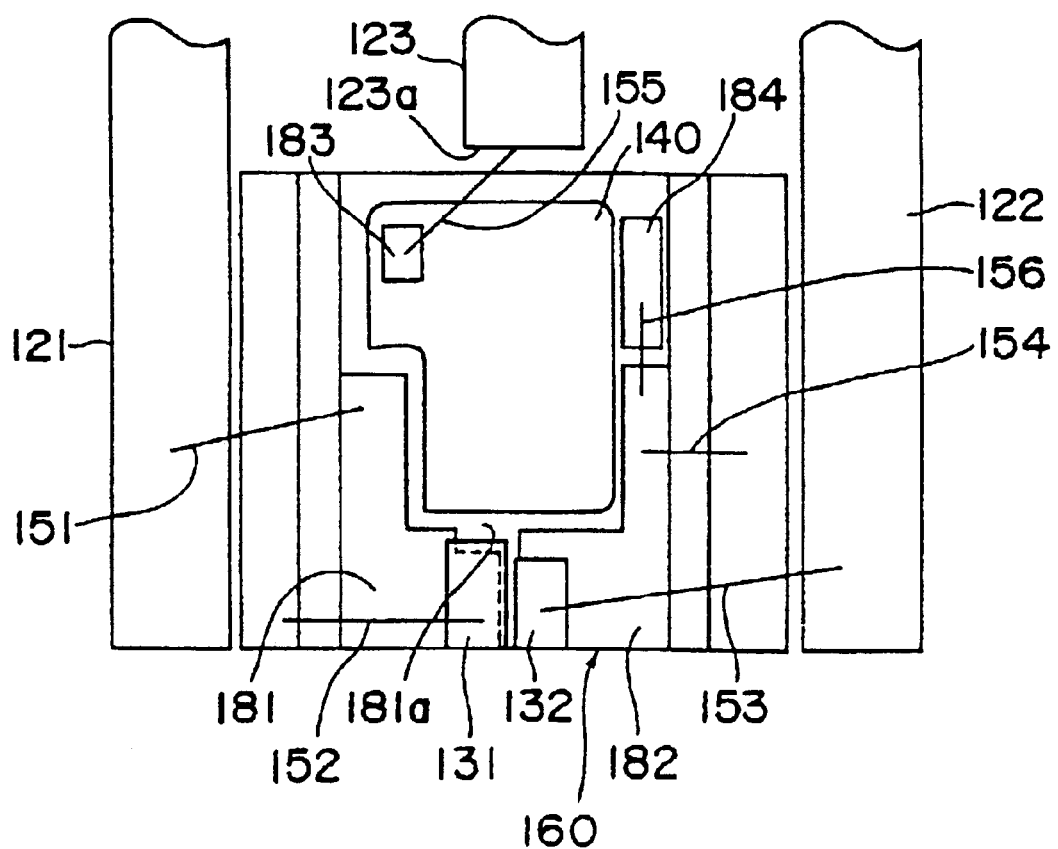
FIG. 3 is a top view of the essential part of the above semiconductor laser device.

FIG. 2 is a front view of the essential part of the semiconductor laser device, while FIG. 3 is a top view of the essential part of the semiconductor laser device shown in FIG. 2. In FIG. 2 and FIG. 3, the eyelet is not shown in order to make the figure easy to see.

As shown in FIG. 2, the two semiconductor laser elements 131 and 132 are die-bonded onto metal lines 181 and 182 (shown in FIG. 3) formed on the sub-mount 160 with a brazing material (not shown) made of an Au—Sn alloy. The two semiconductor laser elements 131 and 132 are arranged on the Si sub-mount 160 so that the optical axes of the emission light become parallel to each other and perpendicular to the surface of the eyelet 101. It is to be noted that the semiconductor laser element 131 has a parallelogram-like section shape and is grown in a crystal form on an off-substrate.

The heat radiation base 102 is provided with stepped portions 111, besides a surface 102a to which the Si sub-mount 160 is die-bonded. The stepped portions 111 are located on both sides of the heat radiation base 102 and have the surfaces 102b that are parallel to the surface 102a and of varying heights. By virtue of the difference in height between the surface 102a and the surface 102b, a silver paste 170 coated on the surface 102a does not spread outwardly of the edge of the surface 102a due to surface tension. As a result, the surface 102b can maintain smoothness and allows the metal wires 152 and 154 to be easily die-bonded even after the Si sub-mount 160 is die-bonded to the heat radiation base 102. The heat radiation base 102 formed integrally with the eyelet 101 (shown in FIG. 1) is electrically connected to the lead pin 124 (shown in FIG. 1) that serves as a common electrode.

The columnar lead pins 121 through 124 are made of metal, however, their surfaces are smoothly finished. Therefore, a contact surface parallel to the upper electrode of the semiconductor laser element 132 exists on the outer peripheral surface of the lead pin 122 and therefore, they are able to be connected with a metal wire 153 by a conventional wire bonding apparatus. Likewise, a metal line 181 (shown in FIG. 3) formed on the Si sub-mount 160 and the lead pin 121 can be connected with a metal wire 151.

As shown in FIG. 3, a cathode 184 of the monitoring PD 140 is connected to the cathode of the semiconductor laser element 132 via a metal wire 156. On the other hand, an anode electrode 183 of the monitoring PD 140 is connected to the end surface 123a of the lead pin 123 via a metal wire 155. The end surface 123a of the lead pin 123 is about perpendicular to the surface of the anode electrode 183 of the monitoring PD 140. Thus connecting together the bonding surfaces that are about perpendicular to each other by way of one metal wire (90° wire) obviates the need for providing a monitoring PD independently of the Si sub-mount. There is no need for exposing the lead pin 123 by providing the eyelet 101 of the stem 100 with a recess 103 (shown in FIG. 1). In other words, it is possible to remove the recess 103. Therefore, the semiconductor components such as the semiconductor laser elements and the monitoring PD can be protected by keeping airtight the inside of the semiconductor laser device with a cap. It is possible to house all the above-mentioned components in a compact package having an outer diameter of 5.6 mm.

Figure 13:
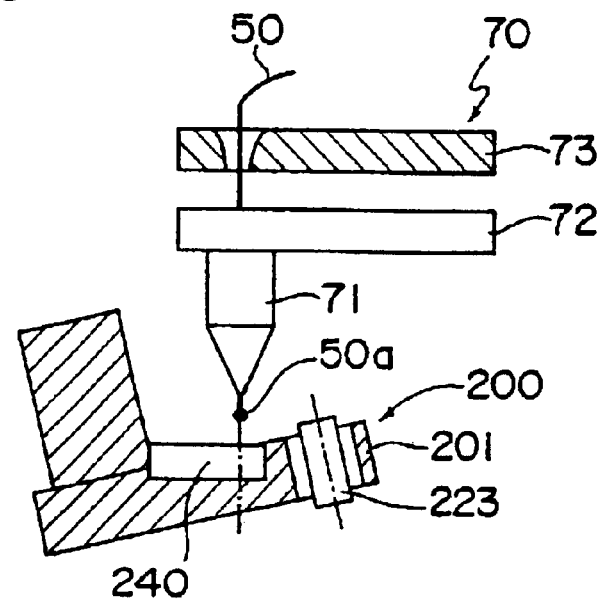
FIG. 13 is a view showing a bonding process of a metal wire of the above semiconductor laser device.
Figure 14:
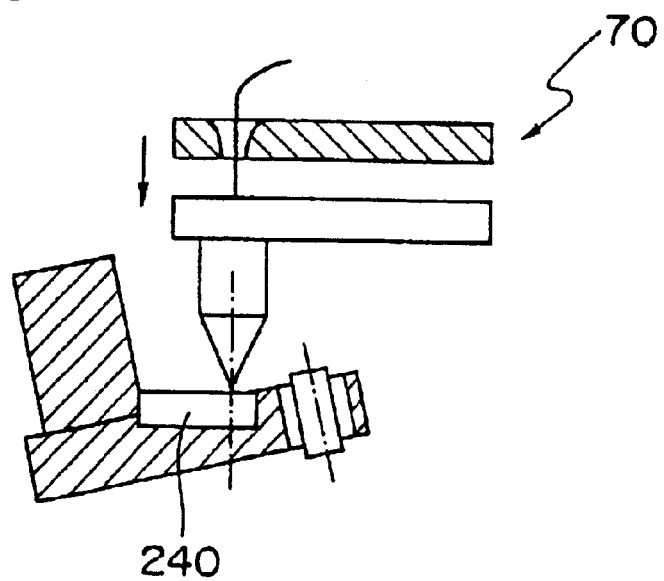
FIG. 14 is a view showing a bonding process subsequent to that of FIG. 13.
Figure 15:
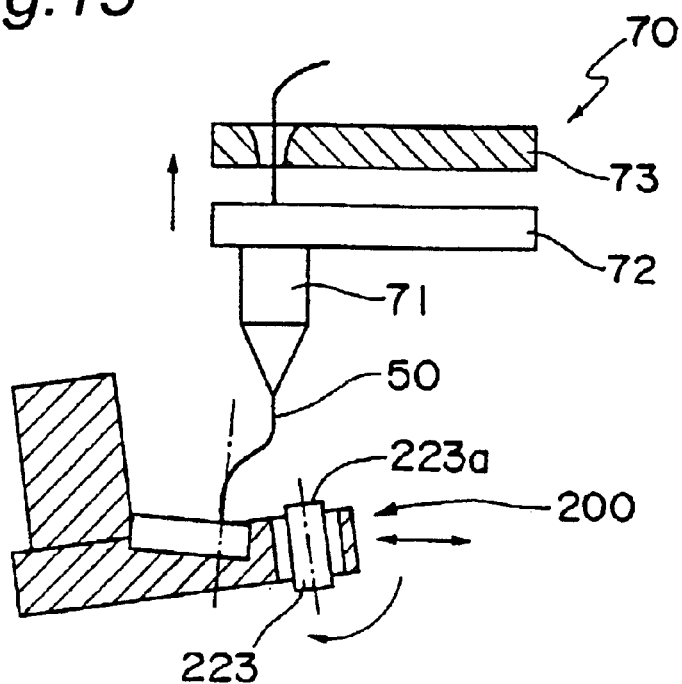
FIG. 15 is a view showing a bonding process subsequent to that of FIG. 14.
Figure 16:
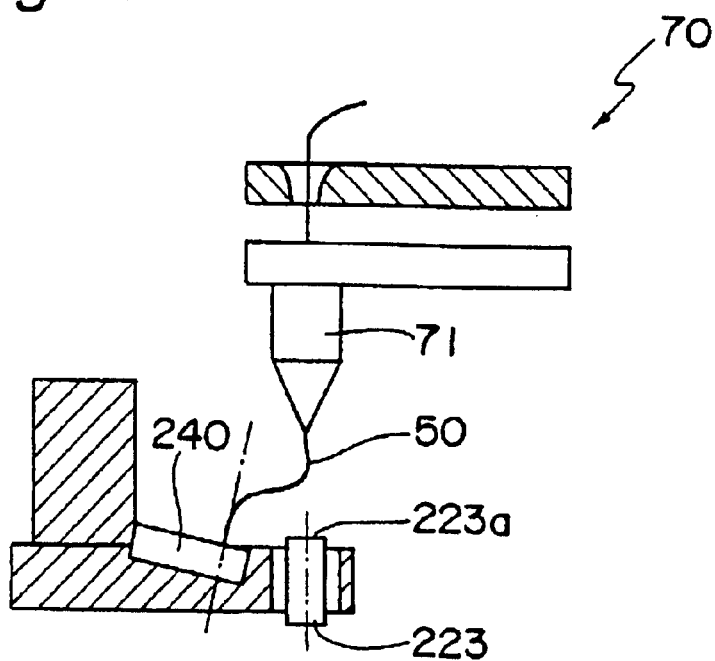
FIG. 16 is a view showing a bonding process subsequent to that of FIG. 15.
Figure 17:
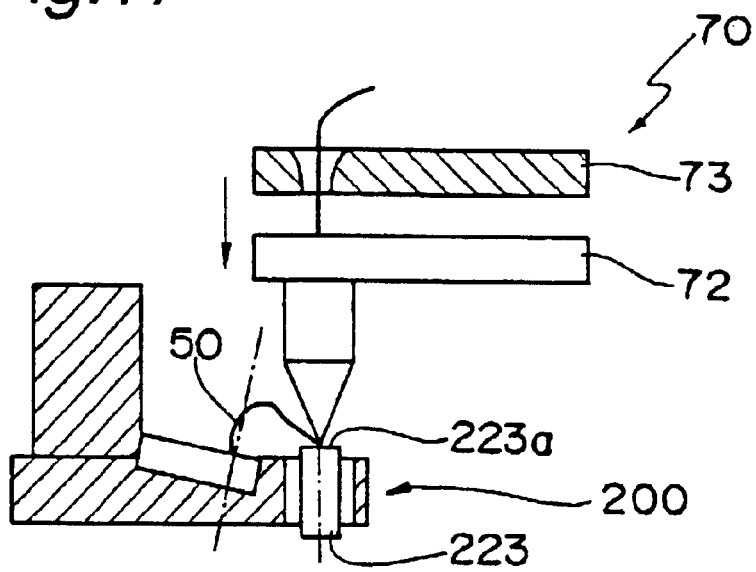
FIG. 17 is a view showing a bonding process subsequent to that of FIG. 16.
Figure 18:
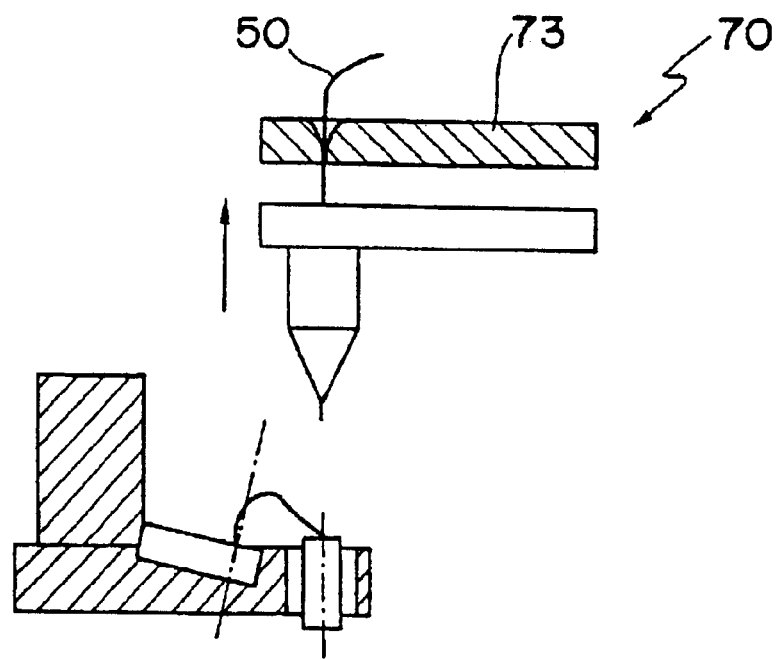
FIG. 18 is a view showing a bonding process subsequent to that of FIG. 17.
Figure 19:
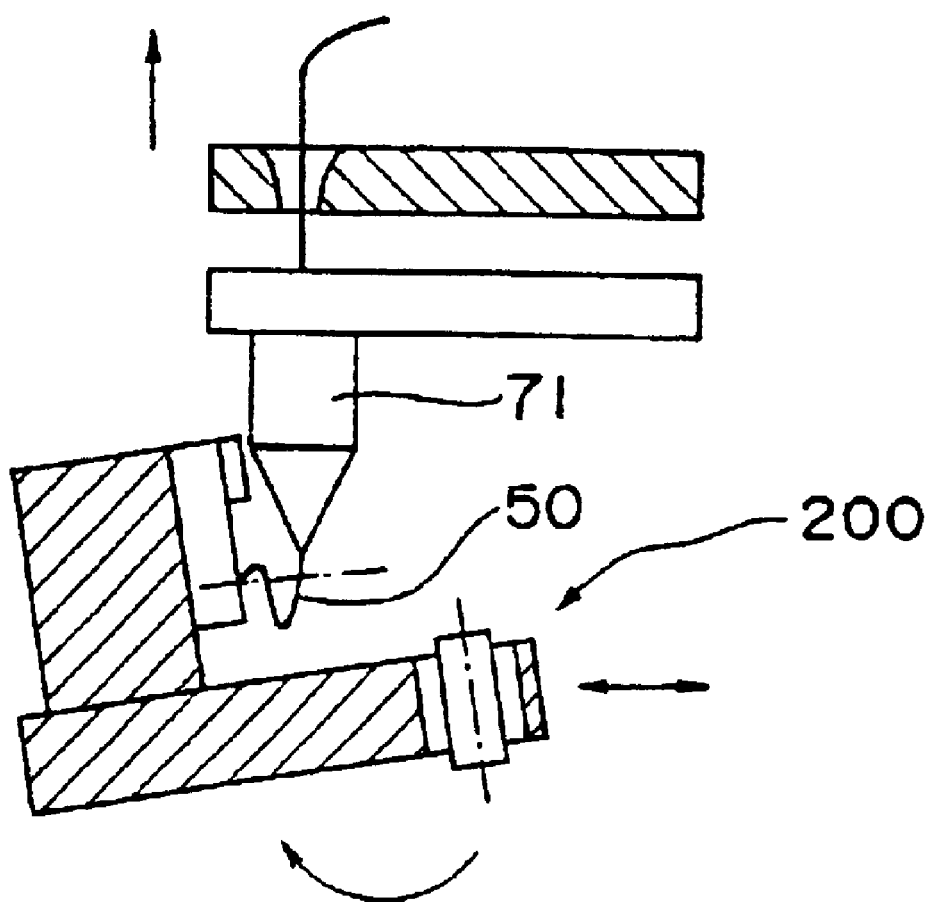
FIG. 19 is an explanatory view showing the case where a stem is turned by an angle of 90° in a metal wire bonding process.

FIG. 4 through FIG. 11 show the wire bonding processes of the aforementioned semiconductor laser device, and the wire bonding method of the aforementioned semiconductor laser device will be described below with reference to FIG. 4 through FIG. 11. The wire bonding apparatus to be used for the wire bonding method of this semiconductor laser device has the same construction as that of the wire bonding apparatus shown in FIG. 13 except for the arrangement that the angle of turn of the stem is 90°, and the same components will be denoted by the same reference numerals with no description provided for the components.

First of all, it is assumed that a first bonding surface is the surface of the anode electrode 183 (shown in FIG. 3)

connected to the anode of the monitoring PD 140 (FIG. 1). It is assumed that a second bonding surface is the end surface 123a of the lead pin 123, and the end surface 123a is made so as not to protrude above the surface 101a of the eyelet 101. This arrangement is adopted to prevent the capillary 71 from colliding against the semiconductor laser elements 131 and 132 on the Si sub-mount 160 by placing the capillary 71 as close to the surface 101a of the eyelet 101 as possible.

A distance from the center axis of the capillary 71 to the end surface 123a of the lead pin 123, or the second bonding surface is assumed to be h1. The stem 100 is thus retained so that the axis of the capillary 71 becomes perpendicular to the first bonding surface (anode electrode 183) of the monitoring PD 140.

Figure 5:
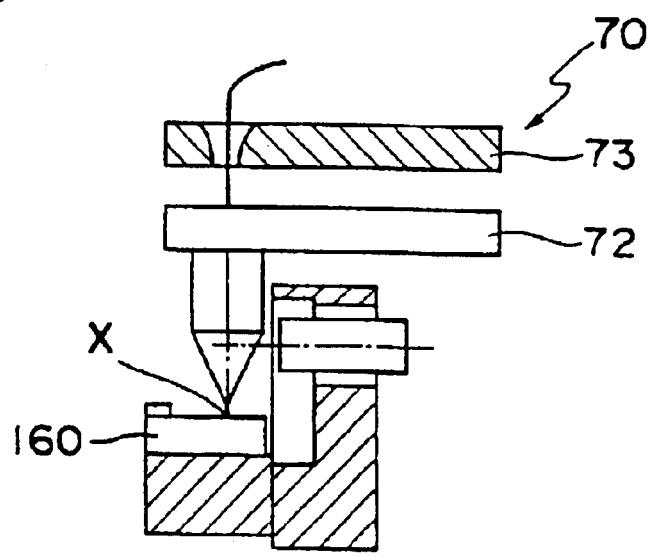
FIG. 5 is a view showing a bonding process subsequent to that of FIG. 4.

Next, the bonding head 70 is moved down as shown in FIG. 5, forming a first bond X.

Figure 6:
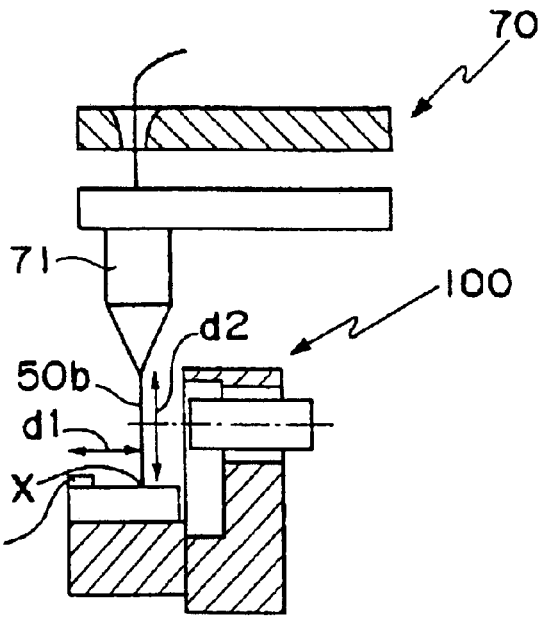
FIG. 6 is a view showing a bonding process subsequent to that of FIG. 5.

Next, the bonding head 70 is moved up as shown in FIG. 6. In this stage, a distance from the tip of the capillary 71 to the first bond X is assumed to be d2. This distance d2 should preferably be made longer than a distance d1 from the front end surface of the semiconductor laser elements 131 and 132 to the first bond X (d2>d1). With this arrangement, the capillary 71 can be prevented from striking against the semiconductor laser elements 131 and 132 when the stem 100 is turned.

Figure 7:
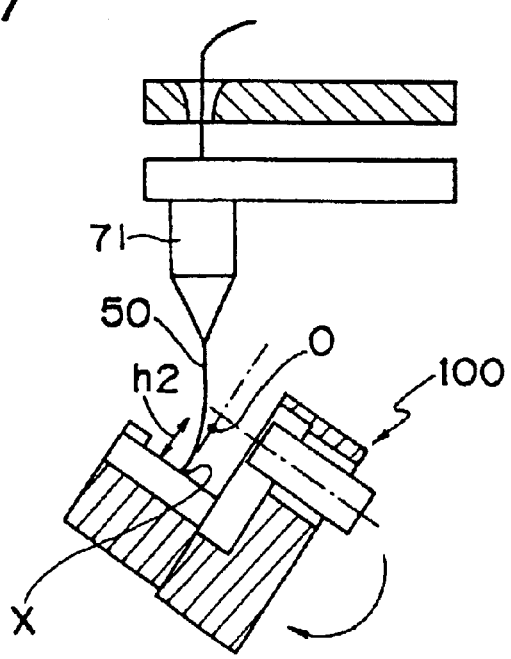
FIG. 7 is a view showing a bonding process subsequent to that of FIG. 6.

Next, as shown in FIG. 7, the stem 100 is turned around an axis O that is located on the metal wire 50 extended between the first bond X and the capillary 71, passes through a point of a specified height h2 from the first bond X and is perpendicular to the plane of the sheet of FIG. 7. The "direction perpendicular to the plane of the sheet" is identical to a direction in which the wire bonding is observed. That is, the axis O around which the stem 100 is turned is made parallel to a line of intersection of the first and second bonding surfaces (anode electrode 183 and end surface 123a) that are approximately perpendicular to each other.

Figure 8:
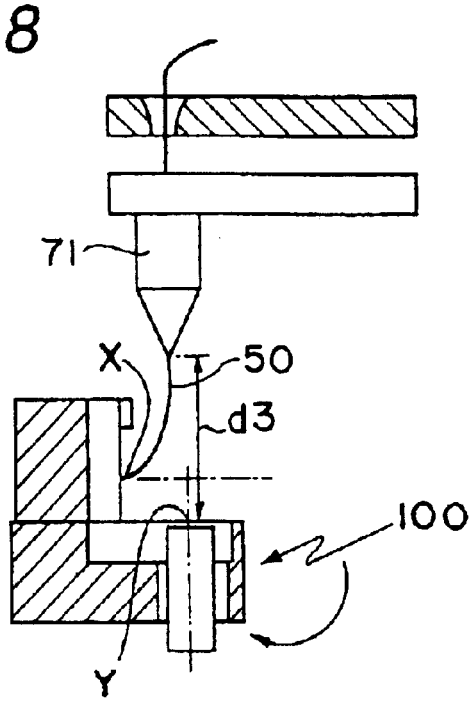
FIG. 8 is a view showing a bonding process subsequent to that of FIG. 7.

By the above operation, as shown in FIG. 8, the distance from the tip of the capillary 71 to the first bond X and the distance from the tip of the capillary 71 to the second bond Y do not substantially change before and after the turn of the stem 100. Therefore, the metal wire 50 is not drawn out of the capillary 71 while the stem 100 is turning, and there is no concern about the disconnection of the metal wire 50.

Figure 4:
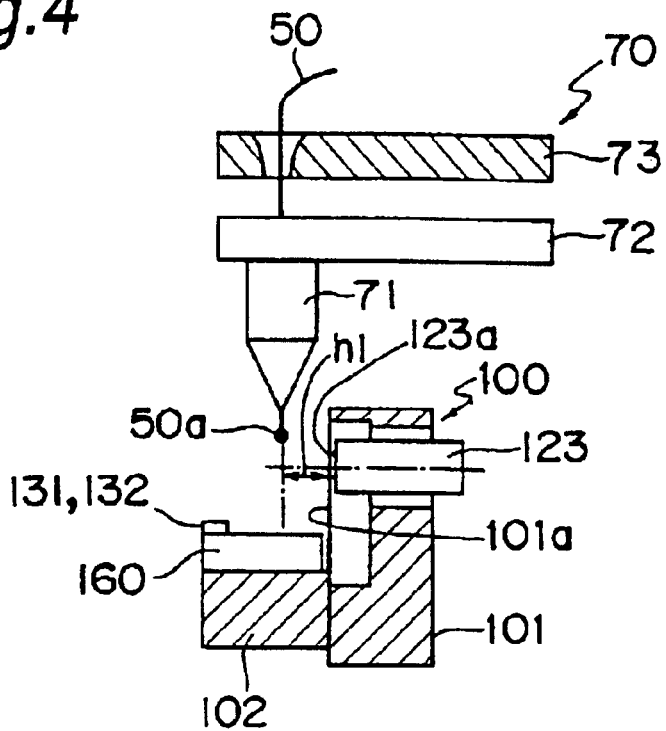
FIG. 4 is a view showing a bonding process of a 90°-wire of the above semiconductor laser device.

More preferably, the height h2 of the axis O of the center of turn of the stem 100 in FIG. 7 is made equal to the height h1 in FIG. 4 (h2=h1). Then, the height d2 from the tip of the capillary 71 to the first bond X shown in FIG. 6 becomes equal to a height d3 from the tip of the capillary 71 to a second bond Y shown in FIG. 8 (d2=d3) before and after the turn of the stem 100, and the state of adhesion of the metal wire 50 can be put in the best state.

Figure 9:
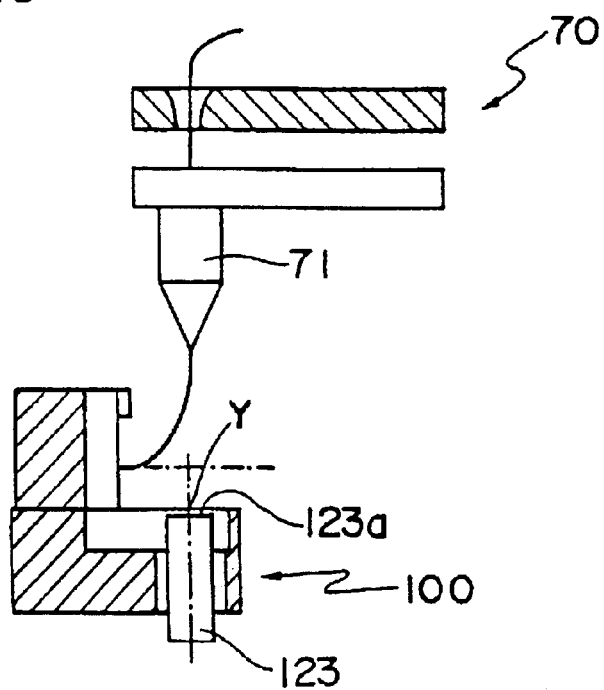
FIG. 9 is a view showing a bonding process subsequent to that of FIG. 8.

Next, as shown in FIG. 9, the bonding head 70 is horizontally moved along the end surface 123a of the lead pin 123 after the stem 100 is turned by an angle of 90°, so that the tip of the capillary 71 is located on a vertical line extending through the second bond Y of the end surface 123a.

Figure 10:
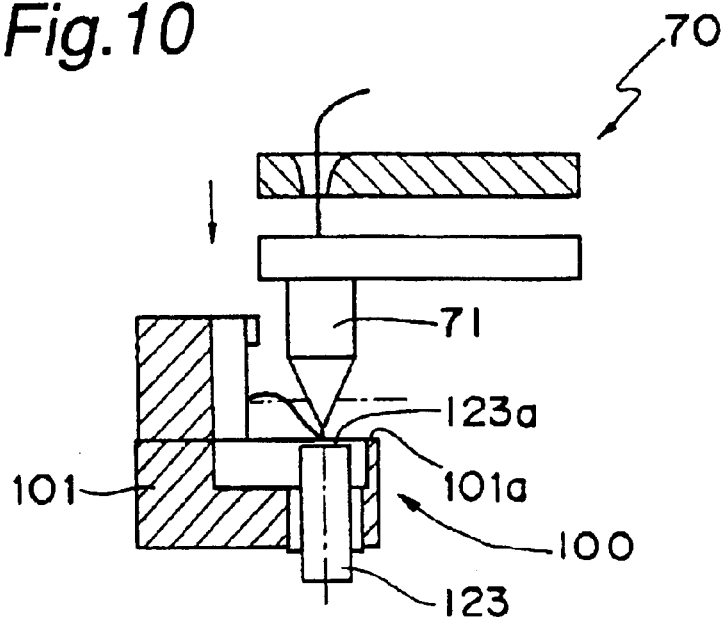
FIG. 10 is a view showing a bonding process subsequent to that of FIG. 9.

Then, the bonding head 70 is moved down again as shown in FIG. 10, performing bonding to the end surface 123a of the lead pin 123 that is the second bonding surface. The end surface 123a of this lead pin 123 is at most about 1 mm lower than the surface 101a of the eyelet 101 of the stem 100, thereby permitting movement of capillary 71.

Figure 11:
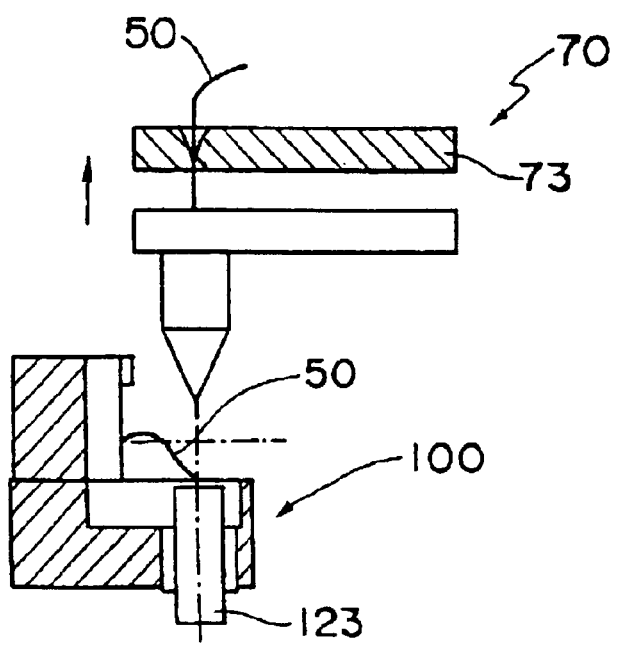
FIG. 11 is a view showing a bonding process subsequent to that of FIG. 10.
Figure 12:
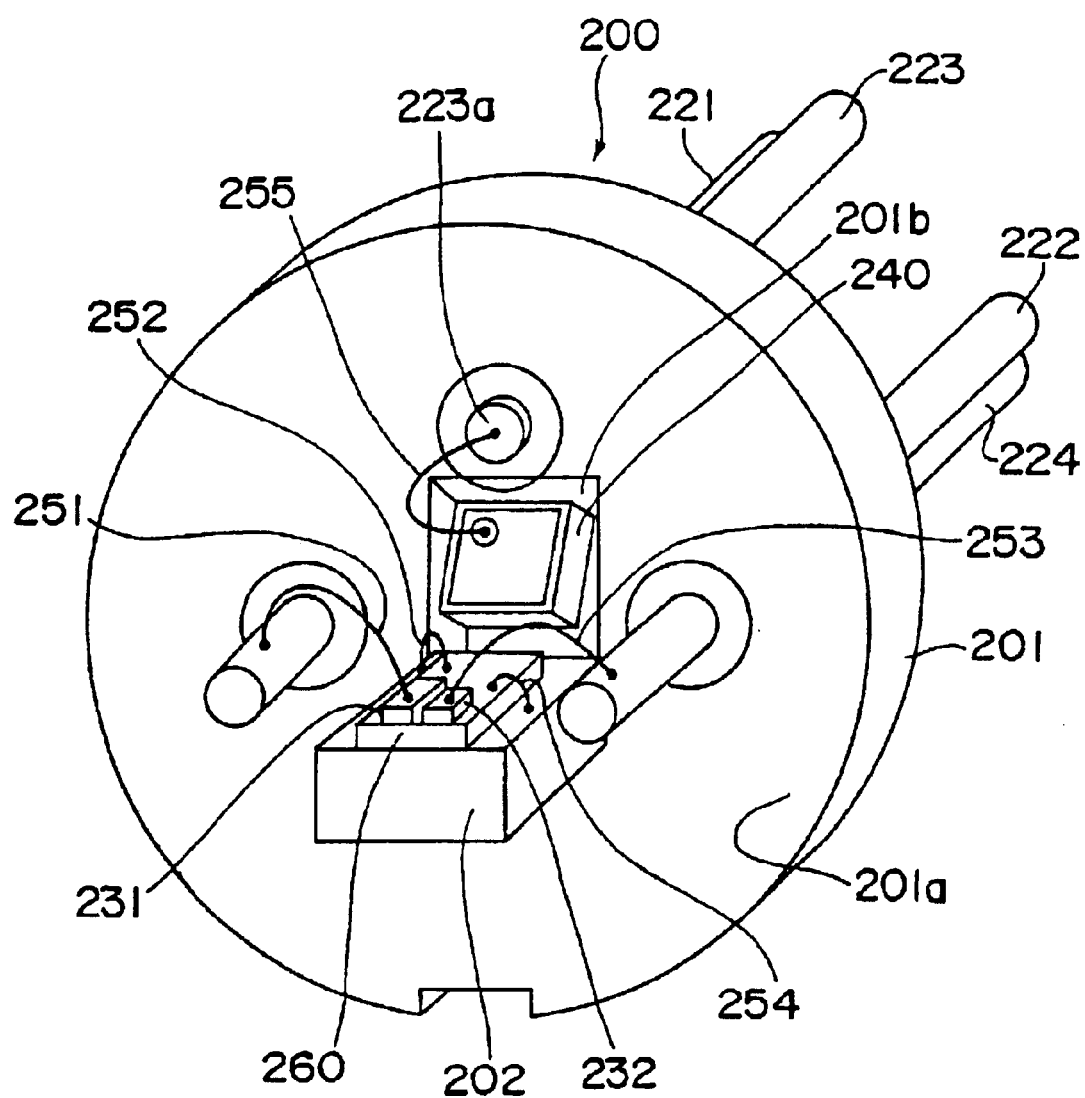
FIG. 12 is a perspective view of a semiconductor laser device having two semiconductor laser elements.

Finally, the wire clamp 73 is closed as shown in FIG. 11, and the bonding head 70 is moved up in the state, cutting the metal wire 50 for the completion of the wire bonding.

The Si sub-mount formed integrally with the monitoring PD 140 will be described next. As is well known, the semiconductor laser element emits laser light not only from the front end surface but also from the rear end surface. This laser light emitted from the rear end surface of the semiconductor laser element is partially incident on the monitoring PD 140 formed integrally with the Si sub-mount 160, and a monitor output from this monitoring PD 140 is used as a semiconductor laser optical output control signal.

In the semiconductor laser device of this embodiment, the semiconductor laser element 132 is of the AlGaAs system in which infrared laser light having a wavelength of 770 nm to 850 nm is emitted and the light emitting point is located approximately 50 μm apart from the surface of the Si sub-mount 160. On the other hand, the semiconductor laser element 131 is of the InGaAlP system in which red laser light having a wavelength of 630 nm to 680 nm is emitted and the light emitting point is located approximately 5 μm apart from the surface of the Si sub-mount 160.

If a height from the light emitting point of the semiconductor laser element 131 to the surface of the Si sub-mount 160 has a small value of approximately 5 μm, then it is preferable to place the monitoring PD 140 as close to the rear end surface of the semiconductor laser element 131 as possible since the monitor signal is increased. However, if the metal line 181 mounted with the semiconductor laser element 131 is protruding even a bit from the rear end surface of the semiconductor laser element 131 to the monitoring PD 140 side, then the emission light of the semiconductor laser is reflected on the metal line, and the monitor signal is reduced in magnitude to a fraction. As a result, the magnitude of the monitor signal of the infrared laser light and the magnitude of the monitor signal of the red laser light significantly differ from each other, and this requires a complicated control circuit. Therefore, according to the semiconductor laser device of this embodiment, the metal line 181 on the Si sub-mount 160 is made to have a pattern that does not protrude on the monitoring PD 140 side in the vicinity of the rear end surface 181a (shown in FIG. 3) of the semiconductor laser element 131.

Although the metal lines 181 and 182 formed on the Si sub-mount 160 also play the role of heat radiation plates for the semiconductor laser element 131 and 132, there is no problem even if the heat radiation becomes worse since the rear end surface of the semiconductor laser element generates heat less than that of the front end surface. In particular, the reflectance of the front end surface is set consistently lower than the reflectance of the rear end surface in the case of a high power semiconductor laser element of which the heat radiation is important, and therefore, the generation of heat in the vicinity of the rear end surface does not become as large as that of the front end surface.

In the semiconductor laser device of this embodiment, the semiconductor laser element 131 has its p-electrode side die-bonded to the metal line 181, while the semiconductor laser element 132 has its n-electrode side die-bonded to the metal line 182. This arrangement is adopted because the red semiconductor laser element 131 has low reliability and it is desired to place the light emitting point in a position as close to the metal line as possible. On the other hand, the infrared semiconductor laser element 132 is more advantageous when the p-side having a higher surface resistance is used as the die bonding surface. There is also the problem that the p-side, which is an epitaxial surface, has significant unevenness, leading to difficult wire bonding. The metal lines 181 and 182 are electrically insulated in the above-mentioned semiconductor laser device. Therefore, even with the above-mentioned arrangement, the two semiconductor laser elements 131 and 132 are arranged not serially but allowed to be arranged parallel depending on the way of connection of the metal wires 151 through 154 as shown in FIG. 2.

As is apparent from the above, according to the semiconductor laser device of the present invention, the electrode surface of the monitoring PD and the wire bonding surface of the lead pin are made to be the surfaces that are perpendicular to each other. As a result, there can be provided a semiconductor laser device in which two semiconductor laser elements and the monitoring PD are mounted on a small-size stem (having a diameter of, for example, 5.6 mm).

The bonding position of the first bonding surface and the bonding position of the second bonding surface are located within the identical plane about perpendicular to those of the first and second bonding surfaces, and the stem is turned along the identical plane in the wire bonding stage. Therefore, the metal wire is not twisted and stress is not applied to the semiconductor laser element and the monitoring PD to which the metal wires are connected. Therefore, the reliability can be improved.

By separately making the metal lines on the Si sub-mount on which the semiconductor laser elements are mounted and electrically insulating the metal lines from each other, the electrical characteristics on the die-bonding side of the two semiconductor laser elements may be different from each other. In other words, it is also possible to die-bond the p-electrode side of one semiconductor laser element and die-bond the n-electrode side of the other semiconductor laser element. Therefore, the degree of freedom in using the semiconductor laser elements is improved.

In order to make a greater amount of emission light from the semiconductor laser elements incident on the monitoring PD formed integrally with the surface of the Si sub-mount, the metal lines on the Si sub-mount are formed so that the vicinities of the light emitting end surfaces of the semiconductor laser elements do not protrude from the semiconductor laser elements. This arrangement is effective particularly for a semiconductor laser element whose light emitting point is located several micrometers higher than the surface the Si sub-mount.

The end surface of the lead pin that serves as the second bonding surface is located at the same height as that of the surface of the stem or lower than the surface of the stem. Therefore, the capillary of the wire bonding apparatus can be prevented from striking against the lead pin that has the second bonding surface when performing wire bonding onto the first bonding surface.

By providing the stem with the stepped portions that are parallel to each other and have a difference in level between the surface to which the Si sub-mount is to be die-bonded and the stem surface to be subjected to wire bonding, the conductive paste is prevented from adhering to the wire bonding surface. This eliminates the possibility of the occurrence of the problem that the metal wire does not adhere to the bonding surface.

According to the semiconductor laser device wire bonding method of the present invention, the metal wire can be connected to the first and second bonding surfaces that are about perpendicular to each other without twisting the metal wire by connecting the metal wire to the first bond and thereafter turning the stem around the axis that extends through the drawn metal wire and is perpendicular to the metal wire.

By setting the axis around which the stem is turned in the direction perpendicular to a plane on which the wire bonding is to be observed, the wire bonding can be performed while observing how the metal wire is twisted. Therefore, no failure of bonding occurs.

By setting the bonding position of the first bonding surface and the bonding position of the second bonding surface in an about identical plane, the metal wires are not twisted and no stress is applied to the semiconductor laser elements and the monitoring PD to which the metal wires are connected. Therefore, the reliability can be improved.

Furthermore, the distance from the axis around which the stem is turned to the first bonding surface is set equal to the distance from the axis around which the stem is turned to the second bonding surface. With this arrangement, the distance from the tip of the capillary of the wire bonding apparatus to the first bonding surface and the distance from the tip of the capillary to the second bonding surface become equal to each other before and after the turn of the stem. Therefore, the wire bonding can easily be performed, and the bonded metal wires can be made hard to come off.

By setting the length of the metal wire to be drawn from the position of the first bonding surface longer than the length from the front end surface of the semiconductor laser element to the first die-bonding position, the capillary can be prevented from striking against the semiconductor laser element when the stem is turned in order to perform wire bonding to the next second bonding surface.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
    a stem provided with a plurality of lead pins;
    a sub-mount that is die-bonded onto the stem and has a surface formed integrally with a monitoring photodiode; and
    two semiconductor laser elements that are die-bonded onto the sub-mount and have emission light monitored by the monitoring photodiode,
    the semiconductor laser elements having electrodes electrically connected to the respective lead pins via metal wires and the monitoring photodiode having an electrode electrically connected to the corresponding lead pin via a metal wire, wherein
    at least one first bonding surface of the two semiconductor laser elements and the monitoring photodiode is approximately perpendicular to a second bonding surface of the lead pin to be wire-bonded to the first bonding surface.

2. A semiconductor laser device as claimed in claim 1, wherein
    a bonding position of the first bonding surface and a bonding position of the second bonding surface are located in an identical plane approximately perpendicular to the first and second bonding surfaces.

3. A semiconductor laser device as claimed in claim 1, further comprising:
    metal lines, which are formed on the sub-mount and to which the two semiconductor laser elements are respectively die-bonded, wherein
    the metal lines corresponding to the semiconductor laser elements are electrically insulated from each other.

4. A semiconductor laser device as claimed in claim 1, further comprising:

metal lines, which are formed on the sub-mount and to which the two semiconductor laser elements are die-bonded, wherein no metal line is formed from a rear end surface of at least one of the two semiconductor laser elements toward the monitoring photodiode.

5. A semiconductor laser device as claimed in claim 1, wherein an end surface of the lead pin is the second bonding surface, and the end surface of the lead pin is located at a height equal to a height of the surface of the stem or lower than the height of the surface of the stem.

6. A semiconductor laser device as claimed in claim 1, wherein the stem is provided with stepped portions having bonding surfaces that are parallel to and different in height from a surface to which the sub-mount is bonded.

7. A semiconductor laser device comprising:

a stem provided with a plurality of lead pins;

a sub-mount die-bonded onto the stem; and a semiconductor laser element die-bonded onto the sub-mount, the semiconductor laser element having an electrode electrically connected to the lead pin via a metal wire, wherein the stem is provided with stepped portions having bonding surfaces that are parallel to and different in height from a surface to which the sub-mount is bonded.

* * * * *